United States Patent [19]

Kinoshita et al.

[11] Patent Number: 4,733,302
[45] Date of Patent: Mar. 22, 1988

[54] IMAGE SENSOR OR AN IMAGE SENSING APPARATUS

[75] Inventors: Takao Kinoshita, Tokyo; Shinji Sakai, Yokohama; Akira Suga, Yokohama; Akihiko Tojo, Yokohama, all of Japan

[73] Assignee: Canon Kabushiki Kaisha, Tokyo, Japan

[21] Appl. No.: 909,937

[22] Filed: Sep. 22, 1986

Related U.S. Application Data

[63] Continuation of Ser. No. 697,155, Feb. 1, 1985, Pat. No. 4,647,978.

[30] Foreign Application Priority Data

Feb. 6, 1984 [JP] Japan ................................. 59-20586

[51] Int. Cl.$^4$ ............................................. H04N 3/15
[52] U.S. Cl. ............................ 358/213.26; 358/213.19
[58] Field of Search ....................... 358/213.15, 213.19, 358/213.24, 213.26, 213.29, 213.31

[56] References Cited

U.S. PATENT DOCUMENTS

| 3,931,463 | 1/1976 | Levine | 358/213.19 |
| 4,528,596 | 7/1985 | Cope | 358/213.15 |
| 4,539,596 | 9/1985 | Elabd | 358/213.24 |
| 4,651,215 | 3/1987 | Bell et al. | 358/213.26 |
| 4,663,669 | 5/1987 | Kinoshita et al. | 358/213.19 |

Primary Examiner—Jin F. Ng
Assistant Examiner—Stephen Brinich
Attorney, Agent, or Firm—Fitzpatrick, Cella, Harper & Scinto

[57] ABSTRACT

An image sensing apparatus comprises: a photo detecting unit for converting an optical image to electrical information; and unnecessary charge transfer unit, formed in the end portion of the photo detecting unit, for transferring the unnecessary charges; a charge removing unit provided at the final end of the unnecessary charge transfer unit; and a drive circuit for driving the unnecessary charge transfer unit synchronously with the transfer of the whole electrical information in the photo detecting unit.

9 Claims, 10 Drawing Figures

IMAGE SENSOR OR AN IMAGE SENSING APPARATUS

This is a continuation of application Ser. No. 697,155, now U.S. Pat. No. 4,647,978, filed Feb. 1, 1985.

BACKGROUND OF THE INVENTION

1. Field of the Invention

The present invention relates to an image sensor or an image sensing apparatus with less noise.

2. Description of the Prior Art

Various kinds of image sensors have been conventionally considered as shown in the Official Gazette of Japanese patent application publication Laid-Open No. 32595/1975.

FIG. 1 is a diagram showing an example of such a sensor.

In the diagram, a reference numeral 1 denotes a photo detecting unit; 2 is a memory unit; 3 a horizontal shift register; 4 an output amplifier; and 5 a photo receiving window corresponding to the window provided in a package of a CCD.

In such a sensor, an optical image entered the photo detecting unit 1 through the window 5 is converted to distribution information of charges. The charge information formed in the photo detecting unit is read out for every horizontal line through the horizontal shift register 3 and output amplifier 3 for a predetermined interval.

Charges are also formed in a semiconductor substrate around the photo detecting unit 1 due to the photo receiving window 5 and these charges leak into the photo detecting unit 1. Thus, there is a drawback such that the noise is easily added to the video signal responsive to the right and left side end portions of the photo detecting unit 1 in the diagram.

In addition, there is another drawback such that thermions are formed even near the memory unit 2 and these thermions leak therein.

SUMMARY OF THE INVENTION

It is an object of the present invention to provide an image sensor or image sensing apparatus of a simple arrangement which can eliminate the abovementioned drawbacks of the conventional technology.

To accomplish the above object, an image sensor of an embodiment according to the present invention comprises a photo detecting unit for converting an optical image to electrical information, unnecessary charge transfer units, formed in the end portions of the photo detecting unit, for transferring unnecessary charges, and charge removing sections, provided at the final ends of the unnecessary charge transfer units, for removing the charges transferred by the unnecessary charge transfer units; therefore, it is possible to obtain an image sensor which can eliminate the influence of the unnecessary charges which are mixed from the end portions of the photo detecting unit with a simple arrangement.

On one hand, an image sensing apparatus of another embodiment of the present invention comprises a photo detecting unit which coverts an optical image to an electrical signal and has transfer electrodes, and driving means for supplying signal to the transfer electrodes for the photo detecting unit in a manner such that the charges in the region in the relatively peripheral portion of the photo detecting unit are read out along a predetermined readout path and at the same time the charges in the region in the relatively inner portion of the photo detecting unit are transferred into a portion different from that readout path; therefore, it is possible to obtain an image sensing apparatus with a good S/N ratio in which the noise can be easily removed.

Other objects and features of the present invention will be apparent from the following detailed description in conjunction with the accompanying drawings.

DETAILED DESCRIPTION OF THE PREFERRED EMBODIMENTS

The present invention will now be described with reference to an embodiment.

Figure 1:
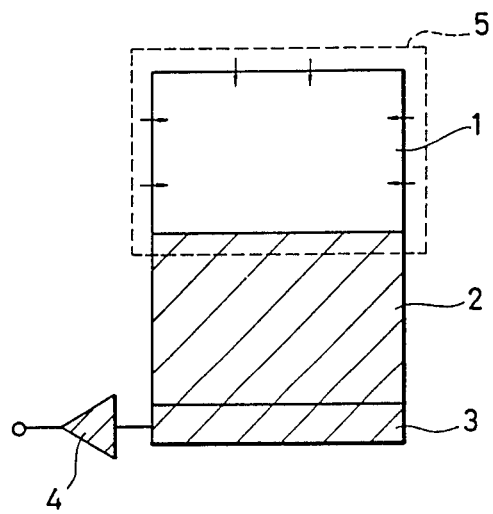
FIG. 1 is a diagram for explaining a conventional example.
Figure 2:
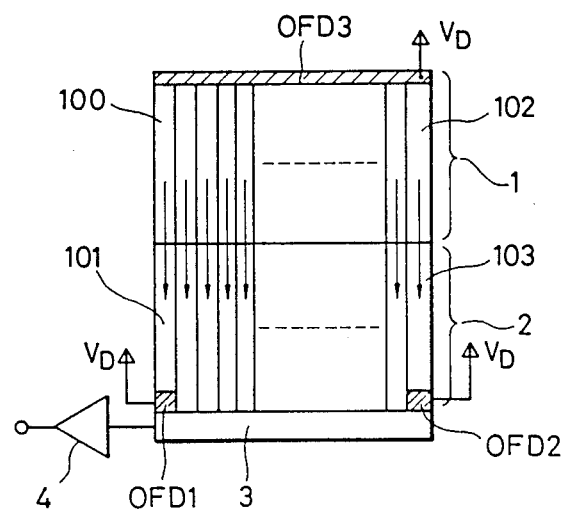
FIG. 2 is a diagram for explaining the first embodiment of an image sensor of the present invention.

FIG. 2 is a diagram showing an arrangement of the first embodiment of an image sensor of the present invention, in which the similar parts and components as those shown in FIG. 1 are designated by the same reference numerals.

The photo detecting unit 1 and memory unit 2 consist of vertical shift registers as many as the same number. The respective vertical shift registers are separated from one another by channel stops.

In the diagram, numerals 100 to 103 denote unnecessary charge transfer units for transferring unnecessary charges, in which the units 100 and 102 are provided in the end portions of the photo detecting unit 1, while the units 101 and 103 are provided in the end portions of the memory unit 2.

On the other hand, the transfer units 100 and 101 and the transfer units 102 and 103 form common charge transfer paths, respectively.

OFD1 to OFD3 indicate drains as charge removing sections, respectively. The OFD1 and OFD2 serve to drain the charges transferred by the transfer units 101 and 103 to the drains, respectively.

The OFD3 serves to drain the charges overflowed in the photo detecting unit 1.

A positive large voltage $V_D$ is applied to each of the drain electrode sections OFD1 to OFD3.

Figure 3:
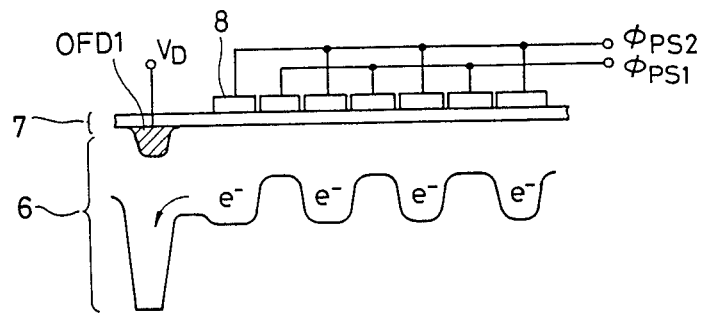
FIG. 3 is a cross sectional diagrammatical view of the main part of the image sensor shown in FIG. 2.
Figure 4:
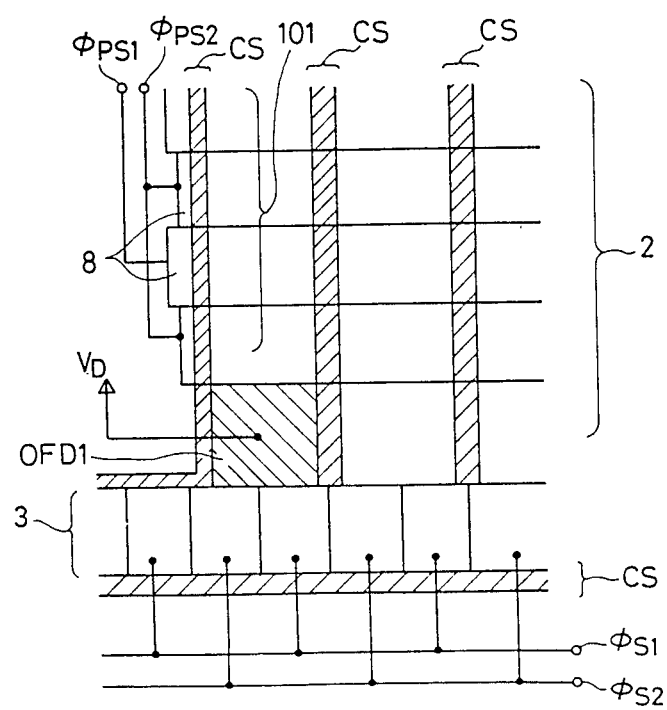
FIG. 4 is an electrode pattern diagram of the main part of the image sensor shown in FIG. 2.

FIG. 3 is a cross sectional diagrammatical view of the charge transfer unit 101 and drain OFD1. FIG. 4 is an electrode pattern diagram near the boundary between the charge transfer unit 101 and the drain OFD1.

In the diagram, a numeral 6 denotes, for instance, a P-type silicon substrate; 7 is an insulation layer consisting of SiO$_2$ or the like; and 8 indicates transfer electrodes made of polysilicon or the like. The transfer electrodes 8 are driven by double phases of transfer pulse $\phi_{PS1}$ and $\phi_{PS2}$.

The OFD1 is formed by, for instance, diffusing an n+ impurity region in the substrate 6 or the like.

CS represents channel stops. $\phi_{S1}$ and $\phi_{S2}$ are transfer pulses to transfer the charges in the horizontal shift register 3. The channel stops CS are likewise driven by double phases of those transfer pulses. The driving method is not limited to double phases.

Figure 5:
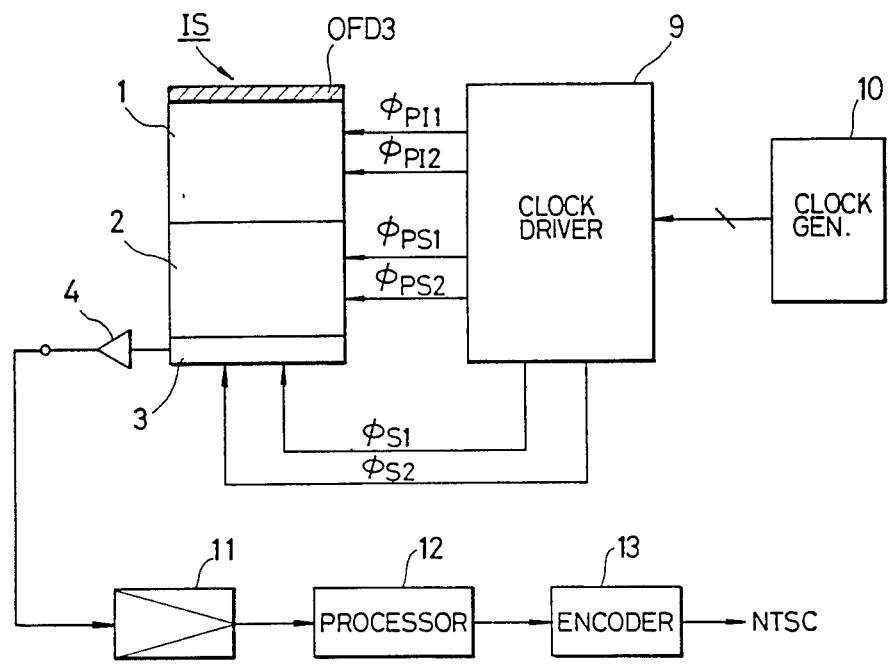
FIG. 5 is a diagram showing an example of an arrangement of an image sensing apparatus using the image sensor shown in FIG. 2.

FIG. 5 is an arrangement diagram of an image sensing apparatus using the image sensor of the first embodiment. In the diagram, a numeral 9 denotes a clock driver serving as drive means for producing drive pulses $\phi_{PI1}$, $\phi_{PI2}$, $\phi_{PS1}$, $\phi_{PS2}$, $\phi_{S1}$, and $\phi_{S2}$ to drive an image sensor IS in response to various kinds of clock signals produced by a clock generator 10. The pulses $\phi_{PI1}$ and $\phi_{PI2}$ are the pulses to transfer the charges in the photo detecting unit.

A numeral 11 denotes a pre-amplifier; 12 is a processor for performing various kinds of corrections such as gamma correction, aperture correction or the like, and a waveform process; and 13 is an encoder for performing modulation or the like to form a standard television signal of the NTSC system or the like.

Figure 6:
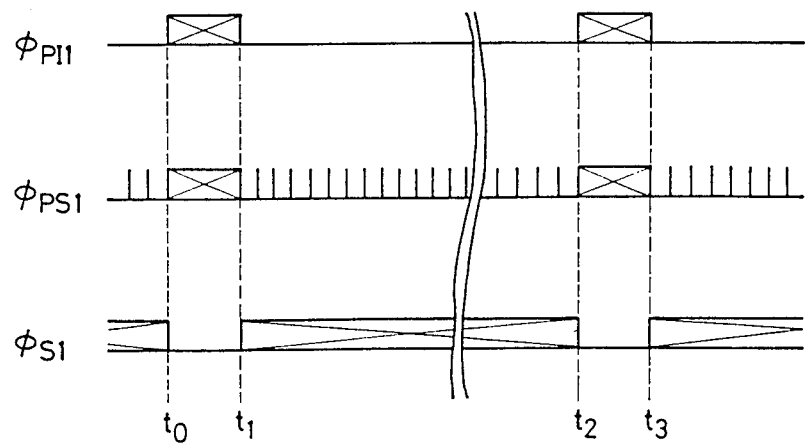
FIG. 6 is a timing chart for the image sensing apparatus of FIG. 5.

FIG. 6 is a diagram showing the timings for the output pulses of the clock driver 9 shown in FIG. 5.

The pulses $\phi_{PI1}$ and $\phi_{PS1}$ and the pulses $\phi_{PI2}$ and $\phi_{PS2}$, which have the phases opposite to the phases of $\phi_{PI1}$ and $\phi_{PS1}$, as many as the number of horizontal lines are supplied at a high-speed for the interval of $t_0$ to $t_1$, thereby allowing the charge information in the photo detecting unit 1 to be transferred into the memory unit 2 and stored therein. Next, a new image is accumulated in the photo detecting unit 1 for the interval of $t_1$ to $t_2$. During this interval, the charge information in the memory unit is taken into the horizontal shift register 3 by an amount as much as one horizontal line by the pulse $\phi_{PS1}$ and pulse $\phi_{PS2}$ having the phase opposite thereto. This charge information is sequentially read out by the pulse $\phi_{S1}$ and pulse $\phi_{S2}$ having the phase opposite thereto.

The pulses $\phi_{PI2}$, $\phi_{PS2}$ and $\phi_{S2}$ have the phases opposite to those of the pulses $\phi_{PI1}$, $\phi_{PS1}$ and $\phi_{S1}$, respectively; therefore, they are omitted in FIG. 6.

As described above, according to the embodiment, the charge transfer units to transfer the unnecessary charges are provided in the end portions of the photo detecting unit 1 and memory unit 2, and the charge removing section are provided at the final ends of the transfer units; therefore, it is possible to prevent the mixture of the thermal or optical unnecessary charges near the peripheral portions of the photo detecting and memory units.

Figure 7:
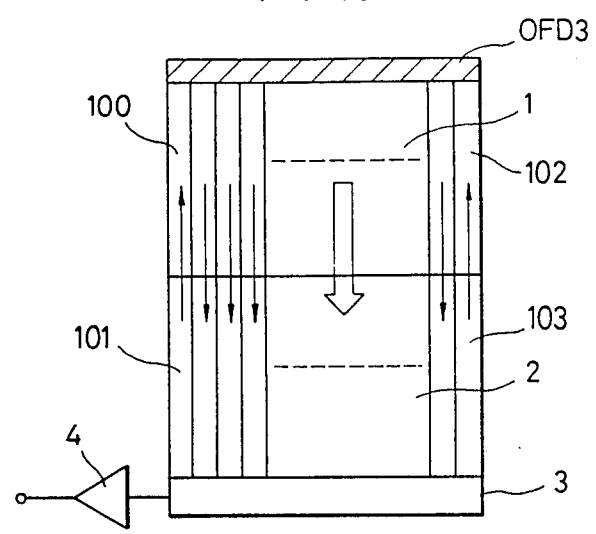
FIG. 7 is a diagram of the second embodiment of an image sensor of the present invention.

Next, FIG. 7 is a diagram showing the second embodiment of an image sensor of the present invention, in which the similar parts and components as those shown in FIGS. 1 to 6 are designated by the same reference numerals.

In this embodiment, in place of providing the drains OFD1 and OFD2, the transfer directions of the charge transfer units 100 to 103 in the end portions of the photo detecting and memory units are reversed as compared with the transfer directions of the effective charges in the photo detecting unit 1 and memory unit 2, thereby causing the unnecessary to be drained into the drain OFD3.

Figure 8:
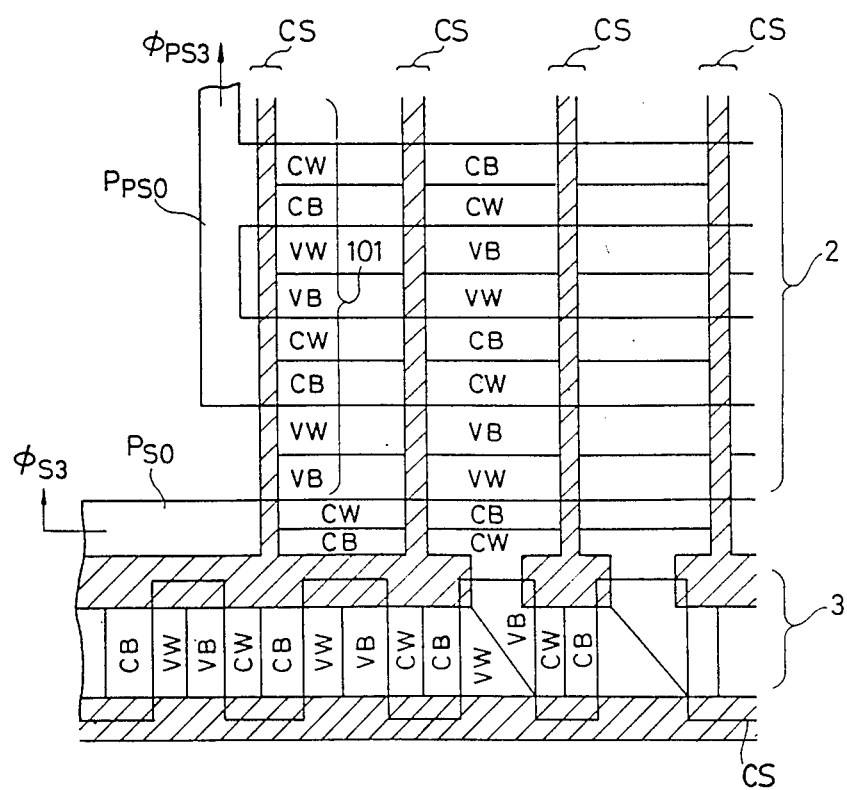
FIG. 8 is an electrode pattern diagram of the main part of the image sensor shown in FIG. 7.

FIG. 8 is a diagram showing an electrode pattern in the boundary region between the charge tarnsfer unit 101 and the horizontal shift register 3.

In the diagram, the similar parts and components as those shown in FIGS. 1 to 7 are designated by the same reference numerals.

In the embodiment, the image sensor is driven due to a single phase drive system.

$P_{PSO}$ a transfer electrode for the memory unit 2; $P_{SO}$ is a transfer electrode for the horizontal shift register 3; CB clocked barriers; CW clocked wells; VB virtual barriers; and VW virtual wells. When it is assumed that the heights of potentials in the CB, CW, VB, and VW with respect to the electrons are respectively P(CB), P(CW), P(VB), and P(VW), the relations of P(CB)>P(CW) and P(VB)>P(VW) are always satisfied. On the other hand, when a voltage at a high level is applied to the electrodes $P_{PSO}$ and $P_{SO}$, the relation of P(VW)>P(CB) is satisfied. When a voltage at a low level is applied, the relation of P(CS)>P(VB) is satisfied.

Such potential steps are formed by, for example, performing the ion implantation into the semiconductor substrate 6. In addition, the inverting layers are formed near the boundary portions between the insulation layer 7 and the semiconductor substrate 6 in the regions of VB and VW, thereby preventing the influence due to the voltage which is applied to the electrode $P_{PSO}$.

In the embodiment, the sequence of the potential steps CB, CW, VB, and VW in the charge transfer units 101 to 103 is set to be opposite to the sequence of the potential steps in the other portions of the photo detecting unit and memory unit. Therefore, by applying an alternating voltage to the electrode $P_{PSO}$, the charges are shifted upwardly in FIG. 8.

Figure 9:
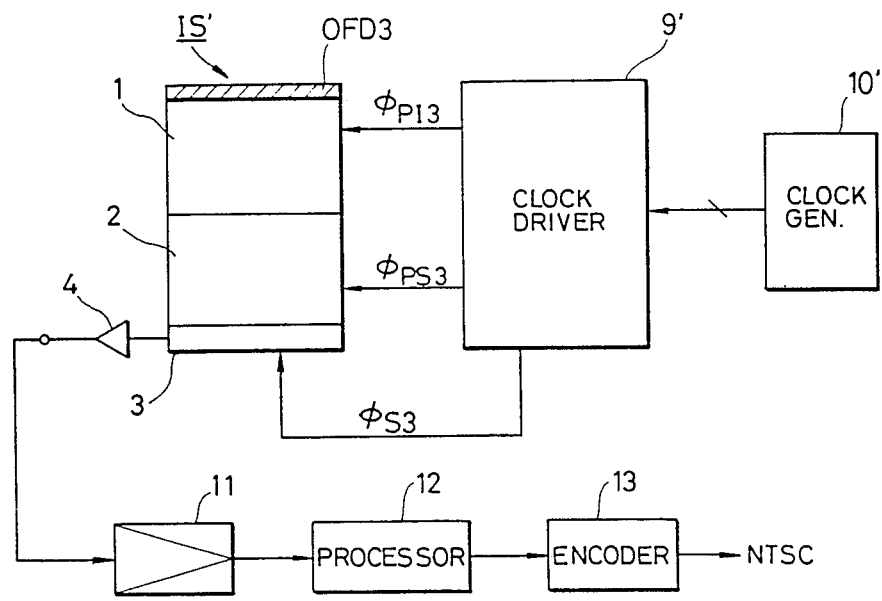
FIG. 9 is a diagram showing an example of an arrangement of an image sensing apparatus using the image sensor shown in FIG. 7.
Figure 10:
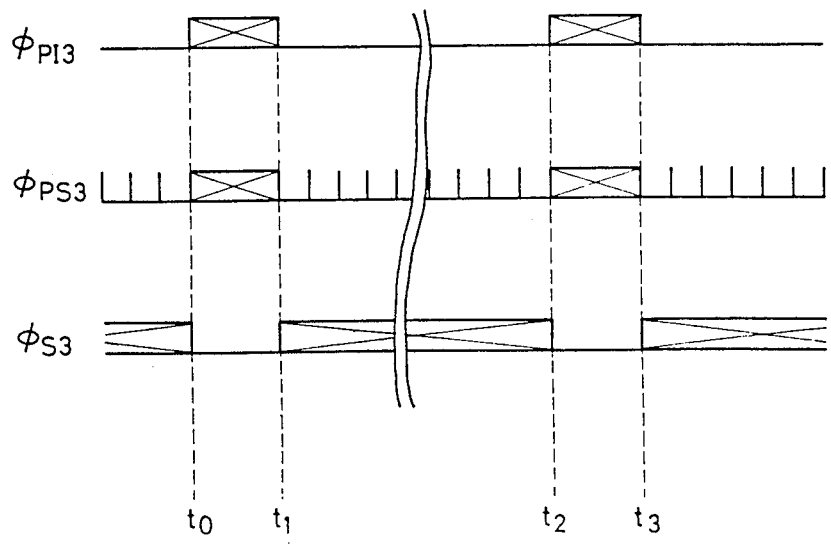
FIG. 10 is a timing chart for the image sensing apparatus of FIG. 9.

FIG. 9 is an arrangement diagram of the second embodiment of an image sensing apparatus of the present invention. FIG. 10 is timing chart for the image sensing apparatus of FIG. 9. In the diagrams, the similar parts and components as those shown in FIGS. 1 to 8 are designated by the same reference numerals.

A numeral 9' denotes a clock driver serving as drive means for generating drive pulses $\phi_{PI3}$, $\phi_{PS3}$ and $\phi_{S3}$ to drive an image sensor IS' in response to output clocks of a clock generator 10'.

As shown in FIG. 10, the pulses $\phi_{PI3}$, $\phi_{PS3}$ and $\phi_{S3}$ respectively correspond to the pulses $\phi_{PI1}$, $\phi_{PS1}$ and $\phi_{S1}$ shown in FIG. 6. For the intervals of $t_0$ to $t_1$ and $t_2$ to $t_3$, the vertical transfer and the removal of the unnecessary charges in the side end portions of the photo detecting unit 1 and memory unit are simultaneously executed by the pulses $\phi_{PI3}$ and $\phi_{PS3}$, so that the charges in the memory unit are read out for every horizontal line for the interval of $t_1$ to $t_2$.

As described above, according to the embodiment, there is no need to use the drains OFD1 and OFD2, so that the arrangement is simple and the wiring pattern can be also simplifed. On one hand, in both first and second embodiments, the transfer electrode for the charge transfer units 100 to 103 and the electrodes for the photo detecting and memory units are commonly used. Consequently, the manufacturing process is also extremely simple and the transfer units 100 to 103 can be driven synchronously with the transfer of the whole charge information in the photo detecting unit without requiring any particular driving electrodes or drive pulses for the charge transfer units 100 to 103.

In addition, according to the present invention, a large noise is not added to the video signal which is read out from the image sensor, so that there is no need to provide a complicated noise removing circuit in the signal processing circuit at the post stage.

On the other hand, the unnecessary charge transfer units are provided in the end portion of both of the photo detecting unit 1 and the memory unit 2 in the foregoing first and second embodiments; however, the invention incorporates an arrangement whereby they are provided only in the end portions of the photo detecting unit.

Further, examples of the drain structure have been mentioned as the charge removing sections to drain the unnecessary charges in the first and second embodiments; however, the charge removing sections also include the charge removing sections to remove the unnecessray charges by periodically performing the recombination of the charges.

What we claim is:

1. Image pickup apparatus comprising:
   (a) image pickup means for converting an optical image into an electrical signal, the image pickup means including:
      (i) first charge transfer means for transferring one part of the electrical signal in a first direction; and
      (ii) second charge transfer means for transferring another part of the electrical signal into a charge drain in a second direction different from said first direction;
   (b) control means for controlling said first and second charge transfer means to simultaneously drive said first and second charge transfer means; and
   (c) encoder means for producing a television signal by using the signal transferred by said first charge transfer means in said image pickup means.

2. Image pickup apparatus according to claim 1, wherein said first and second directions are opposite to each other.

3. Image pickup apparatus according to claim 1, wherein said image pickup means includes a frame transfer type of CCD.

4. Image pickup apparatus according to claim 1, wherein said first charge transfer means transfers electrical signals from a inner portion of said image pickup means.

5. Image pickup apparatus according to claim 1, wherein said second charge transfer means transfers electrical signals from a peripheral portion of said image pickup means.

6. Image pickup apparatus according to claim 1, wherein the charge transfers of said first and second charge transfer means are controlled by a common electrode.

7. Image pickup apparatus comprising:
   (a) image pickup means provided with a photodetector unit which includes a first charge transfer device arranged in a column;
   (b) read-out means for sequentially reading out electrical signals transferred by said first charge transfer device in said photoconductor unit row by row;
   (c) charge drain means disposed at the opposite side to said read-out means in said photodetector unit;
   (d) a second charge transfer device disposed in a column direction at the edge of said photodetector unit, for transferring the electrical signal toward said charge drain means;
   (e) control means for simultaneously driving said first and second charge transfer devices; and
   (f) means for producing a television signal by using the signal transferred through said first charge transfer device.

8. Image pickup apparatus according to claim 7 further comprising a light-shielded storage unit disposed between said photodetector unit in said image pickup means and said read-out means.

9. Image pickup apparatus according to claim 7, wherein the charge transfers of said first and second transfer units are controlled by a common electrode.

* * * * *